United States Patent [19]
Bullock

[11] Patent Number: 4,749,940
[45] Date of Patent: Jun. 7, 1988

[54] FOLDED BAR CURRENT SENSOR

[75] Inventor: Donald Bullock, Somersworth, N.H.

[73] Assignee: General Electric Company, Somersworth, N.H.

[21] Appl. No.: 944,028

[22] Filed: Dec. 22, 1986

[51] Int. Cl.⁴ .......................................... G01R 19/00
[52] U.S. Cl. ................................ 324/127; 324/117 R
[58] Field of Search .......... 324/115, 126, 127, 117 R; 336/171, 181, 182, 223; 323/357

[56] References Cited

U.S. PATENT DOCUMENTS

| | | | |
|---|---|---|---|
| 1,117,293 | 11/1914 | Wilson | 336/171 |
| 1,880,412 | 10/1932 | Burton | 336/182 |
| 2,412,345 | 12/1946 | Lindenblad | 336/182 |
| 3,426,276 | 2/1969 | Schweitzer, Jr. | 324/115 |
| 3,882,387 | 5/1975 | Vikstrom | 324/117 R |
| 3,947,763 | 3/1976 | Milkovic | 324/142 |
| 4,182,982 | 1/1980 | Wolf et al. | 324/127 |
| 4,266,190 | 5/1981 | Lipman | 324/117 R |
| 4,286,211 | 8/1981 | Nakamura et al. | 324/117 R |
| 4,492,919 | 1/1985 | Milkovic | 324/127 |
| 4,496,932 | 1/1985 | Halder | 338/49 |
| 4,513,273 | 4/1985 | Friedl | 336/223 |
| 4,616,174 | 10/1986 | Jorgensen | 324/127 |

FOREIGN PATENT DOCUMENTS 0054020  5/1981  Japan ................................. 323/357

Primary Examiner—Reinhard J. Eisenzopf
Assistant Examiner—W. Burns
Attorney, Agent, or Firm—Robert E. Brunson; Thomas R. Morrison

[57] ABSTRACT

A current sensor employs a folded conductor bar having aligned holes therein to generate magnetic fluxes in the holes proportional to a current flowing in the bar. Each of the two holes has two windings therein wound in opposition to each other but connected for adding their voltages. Corresponding windings in the two holes are wound in opposition to each other and are connected for adding their voltages. The windings in each hole are offset from a center line, whereby magnetic fluxes generated by current flowing in the bar induce voltages in the coils but magnetic fluxes from external sources produce voltages which substantially cancel. A feedback arrangement is disclosed for creating an opposing magnetic flux such that essentially zero magnetic flux is present in the magnetic cores of the windings. A multi-range current measurement device employs a tapped feedback winding selectively connectable to an output amplifier for producing an output voltage having a range set by the number of turns selected on the tapped feedback winding.

11 Claims, 8 Drawing Sheets

FOLDED BAR CURRENT SENSOR

BACKGROUND OF THE INVENTION

The present invention relates to electrical measurement devices and, more particularly, to devices for measuring an electric current passing through a conductor.

Many electronic applications such as, for example, electronic metering of electric power and energy usage, require means for producing a signal proportional to an electric current in a conductor. Conventional current measurement devices employ a current transformer having a primary winding in series with the current to be measured. A resistor in series with a secondary winding of the current transformer produces a voltage having an amplitude proportional to the current in the primary winding. This voltage is then employed as a measure of the primary current.

Conventional current measurement devices suffer from a number of drawbacks. Current transformers are expensive devices and, when employed in high-voltage power sources, require suitable insulation thus further adding to cost. In addition, an output current of a current transformer must be scaled to the current-handling capability of the circuit receiving it. Electronic measurement devices such as, for example, electronic watthour meters, are capable of handling only a few milliamperes of current. Load currents, in contrast, may be several hundred amperes. For example, if a single primary turn is employed in such a current transformer, on the order of 100,000 secondary turns are required to produce a full-scale current in the presence of a load current of, for example, 300 amperes. Conventional toroidal transformer cores do not provide sufficient room for this many turns in a device of practical size. In addition, such current transformers require a low value of burden resistance to function with adequate accuracy. A winding with such a large number of turns has an inherently high resistance, thus precluding operation with the required accuracy.

The prior art contains several approaches for dividing a load current in order to produce a sample current or voltage proportional to the load current. A shunt technique, disclosed in U.S. Pat. Nos. 4,182,982 and 4,492,919, splits the current in a conductor between a main shunt path and a parallel auxiliary path. The auxiliary path contains a much smaller cross section than does the main shunt path and current through the combination divides in substantially the ratio of the cross sections. A magnetic core with a winding of many turns is disposed about the auxiliary path. The auxiliary path thus forms a one-turn primary and the many turns about it form a secondary. A current through the secondary is proportional to the current in the primary divided by the number of turns in the secondary. This technique suffers reduced accuracy from the substantial thermal coefficient of resistance of copper which may be as much as 30 percent over the environmental temperature range to which watthour meters are exposed. In addition, it is difficult to obtain a sufficient current division to give the four orders of magnitude reduction in output current compared to load current. Finally, this technique is subject to errors resulting from magnetic flux about the current-carrying conductor making up the shunt path.

A further technique, disclosed in U.S. Pat. No. 4,496,932, employs two slits in a conductor to produce a measurement conductor between a pair of shunt conductors. The measurement conductor is deflected, first in one direction, and then in the other, to provide space for the passage of a one-turn loop of magnetic core material therethrough. In one embodiment, the shunts and the measurement conductor are folded to align holes in two halves thereof. The one-turn loop of magnetic core material is then passed through the aligned holes for receiving a sample of leakage current produced by the presence of the slits and the measurement conductor. A secondary winding of many turns on the core loop provides an output. This device suffers from the presence of strong magnetic fields in its vicinity which are capable of saturating the core and thus introducing errors or cancelling its output. In addition, no provision is provided for cancelling the effects of non-uniform magnetic fields originating external to the measurement device, as are routinely experienced in watthour meters.

Other special problems are encountered in watthour meters. The external configuration, including the positions of connector blades, is established by rigid industry standards. Such industry standards also require that crosstalk between adjacent phases be held to a very low level.

OBJECTS AND SUMMARY OF THE INVENTION

It is an object of the invention to provide a current sensor which overcomes the drawbacks of the prior art.

It is a further object of the invention to provide a current sensor that does not require a current transformer.

It is a further object of the invention to provide a current sensor having substantial immunity to external magnetic fields.

It is a still further object of the invention to provide a current sensor having a plurality of windings, all of the plurality of windings adding voltage produced by magnetic fields generated by a current to be measured and subtracting voltage generated as the results of external magnetic fields.

It is a still further object of the invention to provide a current sensor having at least first and second windings on a core disposed in aligned holes in a folded, current-carrying bar. The winding directions of the first and second windings are opposite whereby current in the two parts of the folded bar add together to produce an output.

It is a still further object of the invention to provide a current sensor having two magnetic cores each containing two, oppositely-wound, windings. The four windings on the two cores produce additive output as a result of magnetic fields generated by current passing therepast through the bar but cancel the effects of external magnetic fields.

It is a still further object of the invention to provide a current sensor employing at least one magnetic core disposed in aligned holes in a folded bar and a feedback winding from an active circuit effective to balance the magnetic field generated by the current through the bar.

Briefly stated, the present invention provides a current sensor employing a folded conductor bar having aligned holes therein to generate magnetic fluxes in the holes proportional to a current flowing in the bar. Each of the two holes has two windings therein wound in opposition to each other but connected for adding their currents. Corresponding windings in the two holes are wound in opposition to each other and are connected for adding their voltages. The windings in each hole are offset from a center line whereby magnetic fluxes generated by current flowing in the bar induce voltages in the coils but magnetic fluxes from external sources generate voltages which substantially cancel. A feedback arrangement is disclosed for balancing the magnetic fluxes in the holes. A multi-range current measurement device employs a tapped feedback winding selectively connectable to an output amplifier for producing an output current having a range set by the number of turns selected on the tapped feedback winding.

According to an embodiment of the invention, there is provided a current sensor for measuring a current, comprising: a first conductor bar having a first generally planar surface, a second conductor bar having a second generally planar surface disposed parallel to the first generally planar surface, a predetermined gap between the first and second generally planar surfaces, means for connecting adjacent first ends of the first and second conductor bars, means for feeding the current to a second end of the first conductor bar, means for receiving the current from a second end of the second conductor bar, a first hole generally centered in the first conductor bar and having a first axis substantially normal to the first generally planar surface, a second hole generally centered in the second conductor bar and having a second axis substantially normal to the second generally planar surface, the first and second axes being collinear, first and second coils in the first hole, third and fourth coils in the second hole, means for interconnecting the first, second, third and fourth coils to produce an output signal in response to magnetic fields in the first and second holes resulting from the current in the first and second conductor the, bars first and second coils being wound to add voltages produced by magnetic fields within the first hole and to cancel voltages produced by magnetic fields originating outside the first hole, the third and fourth coils being wound to add voltages produced by magnetic fields within the second hole and to cancel voltages produced by magnetic fields originating outside the second hole, the first and third coils being wound to add voltages produced by magnetic fields within the first and second holes and to cancel voltages produced by magnetic fields originating outside the first and second holes, and the second and fourth coils being wound to add voltages produced by magnetic fields within the first and second holes and to cancel voltages produced by magnetic fields originating outside the first and second holes, whereby substantial immunity to magnetic fields originating external to the first and second holes is achieved.

According to a feature of the invention, there is provided a coil assembly for a current sensor comprising: first and second collinear windings, the first and second collinear windings being connectable in series and having a winding sense effective for cancelling voltages produced by magnetic fields applied substantially equally thereto, third and fourth collinear windings, the third and fourth collinear windings being connectable in series and having a winding sense effective for cancelling voltages produced by magnetic fields applied substantially equally thereto, means for disposing an axis of the first and second collinear windings parallel to an axis of the third and fourth collinear windings with the first and third windings adjacent each other and the second and fourth windings adjacent each other, the first, second, third and fourth windings being connectable in series, the first and third windings having a winding sense effective for cancelling voltages produced by magnetic fields applied substantially equally thereto, and the second and fourth windings having a winding sense effective for cancelling voltages produced by magnetic fields applied substantially equally thereto.

According to a further feature of the invention, there is provided a method for measuring a current, comprising: forming a folded bar including a first conductor bar having a first generally planar surface, disposing a second conductor bar having a second generally planar surface parallel to the first generally planar surface, spacing the first and second generally planar surfaces a predetermined distance apart, connecting adjacent first ends of the first and second conductor bars, feeding the current to a second end of the first conductor bar, receiving the current from a second end of the second conductor bar, forming a first hole generally centered in the first conductor bar and having a first axis substantially normal to the first generally planar surface, forming a second hole generally centered in the second conductor bar and having a second axis substantially normal to the second generally planar surface, the first and second axes being collinear, disposing first and second coils in the first hole, disposing third and fourth coils in the second hole, interconnecting the first, second, third and fourth coils to produce an output signal in response to magnetic fields in the first and second holes resulting from the current in the first and second conductor bars, winding the first and second coils to add voltages produced by magnetic fields within the first hole and to cancel voltages produced by magnetic fields originating outside the first hole, winding the third and fourth coils to add voltages produced by magnetic fields within the second hole and to cancel voltages produced by magnetic fields originating outside the second hole, winding the first and third coils to add voltages produced by magnetic fields within the first and second holes and to cancel voltages produced by magnetic fields originating outside the first and second holes, and winding the second and fourth coils to add voltages produced by magnetic fields within the first and second holes and to cancel voltages produced by magnetic fields originating outside the first and second holes, whereby substantial immunity to magnetic fields originating external to the first and second holes is achieved.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

A current sensor according to the present invention may be employed for measuring a current in a conductor associated with any type of electrical equipment. For concreteness, a current sensor in accordance with an embodiment of the invention is disclosed in the environment of an electronic watthour meter. This environment is chosen at least partly because problems of measurement accuracy, and the disturbance thereof from external magnetic fields, are more severe than in most other environments.

Also, although the current sensor of the present invention is considered to be especially useful in measuring currents flowing in each of a plurality of phases of a poly-phase electronic watthour meter, it is considered that its description in the environment of a single-phase electronic watthour meter avoids unnecessary functional duplication and therefore aids in understanding the invention. Thus, measurement of current in a single-phase electronic wattmeter is described in detail.

Figure 1:
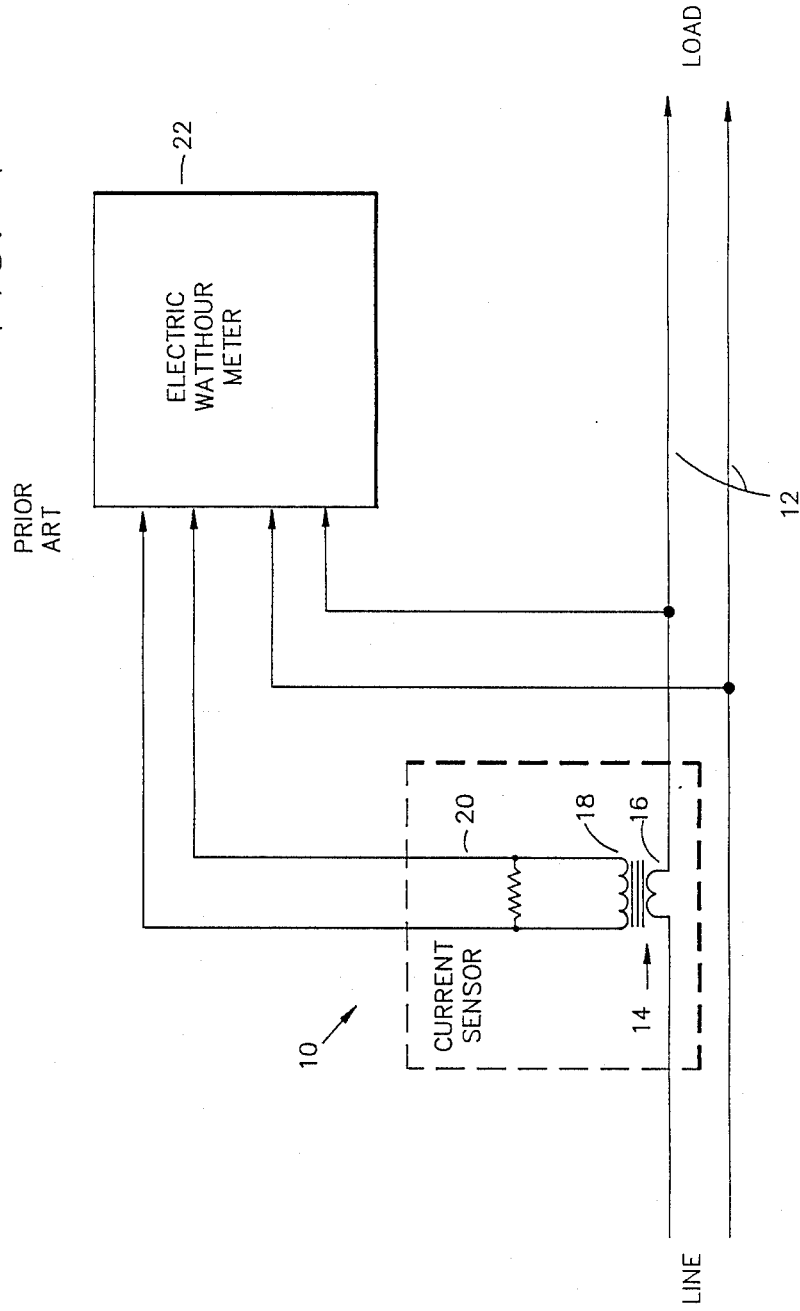
FIG. 1 is a simplified schematic diagram of an electric meter showing a current sensor according to prior art.

Referring now to FIG. 1, there is shown, generally at 10, a current sensor of the prior art which produces a voltage proportional to a current being fed on an AC line 12 to a load (not shown). A current transformer 14 includes a primary winding 16 in series with one conductor of AC line 12. A secondary winding 18 has a current therein proportional to the AC current in primary winding 16. The current in secondary winding 18 passes through a resistor 20 to develop a voltage thereacross proportional to the secondary current. The voltage is applied to inputs of an electronic watthour meter 22. A voltage across AC line 12 is connected to electronic watthour meter 22, wherein an electronic multiplication process determines an instantaneous value of watts consumed by the load. A conventional integrating device (not shown) in electronic watthour meter 22 integrates the consumed watts to derive the energy consumed.

Electronic watthour meter 22 may be of any convenient type such as, for example, an electronic watthour meter according to the teaching of U.S. Pat. No. 3,947,763, of common assignee with the present invention. Such electronic devices require signals proportional to load current at values as much as five orders of magnitude smaller than the load current itself. This is difficult to attain in a practical current transformer 14. In addition, the need for a current transformer 14 adds to the overall cost of the equipment and elimination of this element is therefore considered desirable.

Figure 2:
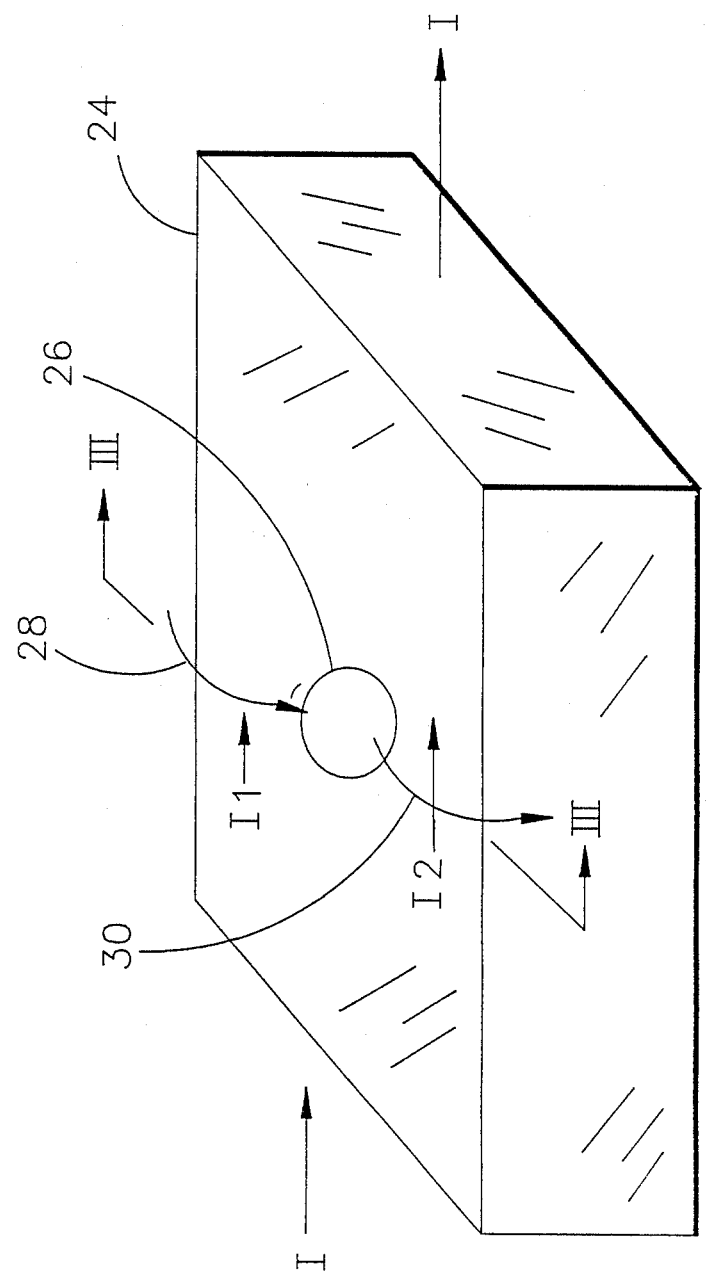
FIG. 2 is a perspective view of a conductor bar to which reference will be made in describing the principle of operation of the present invention.

Referring now to FIG. 2, there is shown a conductor bar 24 having an electric current I flowing therethrough. A hole 26, bored through conductor bar 24, separates current I into separate currents I1 and I2 on either side of hole 26. Current I1 produces a magnetic flux 28 which, in conventional notation, is indicated as flowing into the top of hole 26. Current I2 produces a magnetic flux 30 which, in conventional notation, is shown flowing out of the top of hole 26.

Figure 3:
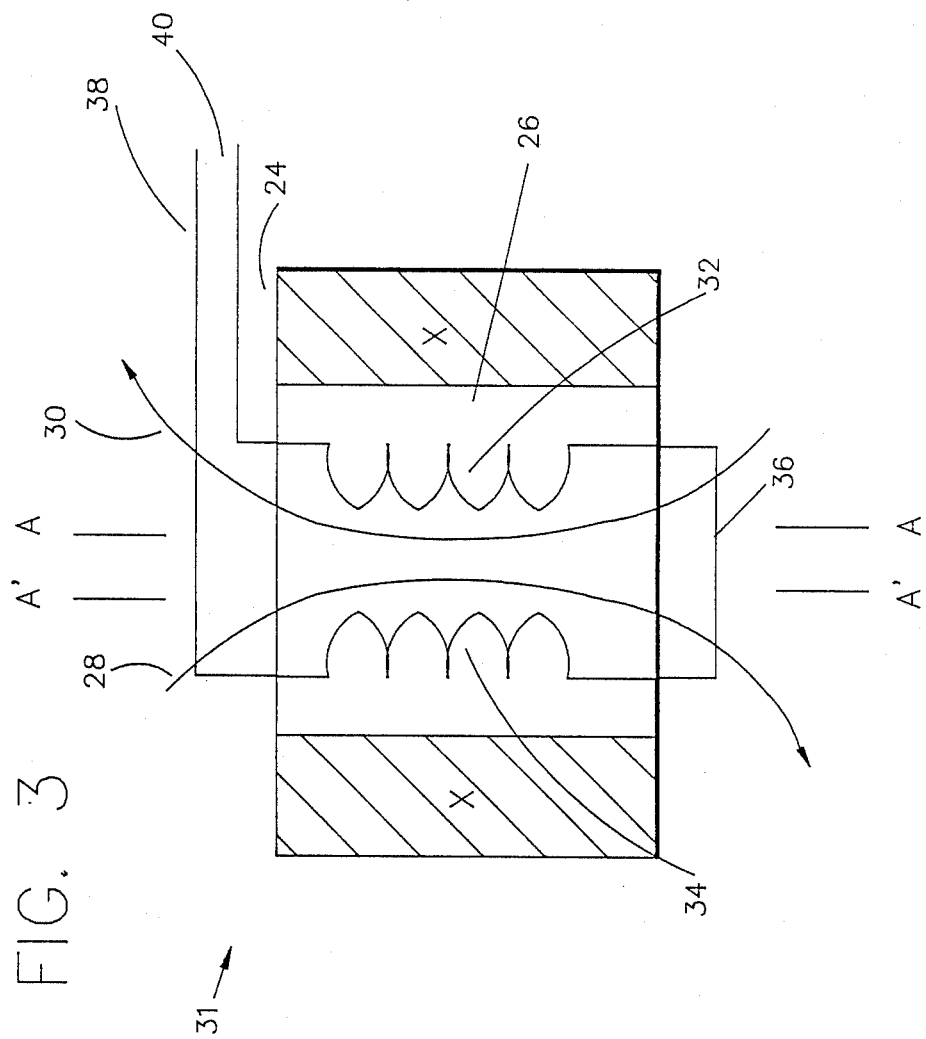
FIG. 3 is a cross section taken along III—III in FIG. 2.

FIG. 3 shows a cross section of conductor bar 24 through hole 26 and transverse to the direction of current I. Magnetic fluxes 28 and 30 oppose each other and, if equal, would cancel each other along an axis of hole 26. Conductor bar 24 and hole 26, along with first and second pickup coils 32 and 34 form a current sensor 31 according to an embodiment of the invention. First pickup coil 32 is disposed along an axis A—A, displaced from an axis of hole 26. Thus, it is influenced more by magnetic flux 30 and less by magnetic flux 28 and a voltage is induced in pickup coil 32 by an AC current in conductor bar 24. If only a single pickup coil 32 were employed in hole 26, it would be fully responsive to external magnetic fields. To compensate at least partly for such external magnetic fields, second pickup coil 34 is disposed on an axis A'—A', displaced in the opposite direction from the axis of hole 26. It also has a voltage induced therein. A connection 36 joins one end of pickup coils 32 and 34. Pickup coils 32 and 34 are wound in opposite directions whereby their voltages, induced by magnetic fluxes 28 and 30, add together.

The opposite winding directions of pickup coils 32 and 34 tend to cancel the effects of those external magnetic fields which affect them equally. This cancellation is more effective as pickup coils 32 and 34 are brought closer together. Some external magnetic fields may not be oriented to affect pickup coils 32 and 34 equally. In such an event, the voltages generated in pickup coils 32 and 34 by such magnetic fields do not cancel and inaccuracies in the relationship between output current and current I may exist. In non-critical applications, or those in which external magnetic fields are small, this embodiment may be capable of providing sufficient accuracy.

Since only a small amount of flux is induced to enter and leave hole 26, a substantial ratio is found between the current flowing in conductor bar 24 and the voltage across pickup coils 32 and 34. The resulting output voltage of pickup coils 32 and 34, fed on lines 38 and 40 to external circuits, may be of a low enough level for direct feeding to the input of an electronic watthour meter without requiring an intermediate current transformer. In this manner, the overall system, including the electronic watthour meter, is of reduced complexity and cost. Indeed, such a current sensor may be made small enough for inclusion within the housing of a conventional electronic watthour meter whose dimensions are governed by industry standards.

Figure 4:
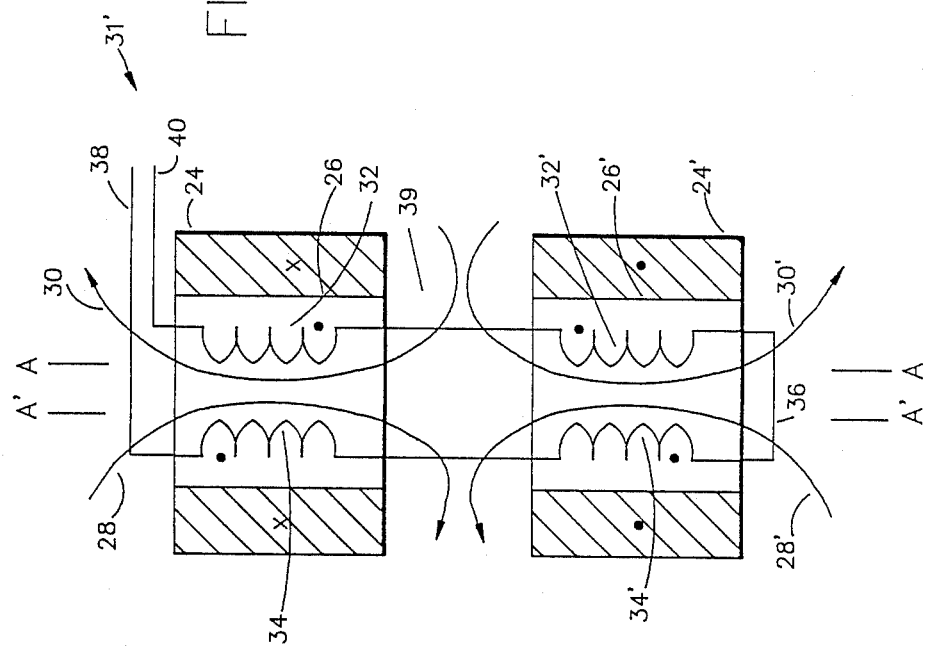
FIG. 4 is a cross section corresponding to FIG. 3 except including two conductor bars and two pairs of sensing windings.

Referring now to FIG. 4, a current sensor 31' employs a folded configuration in which conductor bar 24 is paralleled by a conductor bar 24' carrying the same current I, but in the opposite direction as indicated by conventional indicators of current direction. A gap 39 is formed between facing surfaces of conductor bars 24 and 24'. Conductor bar 24' includes a hole 26' aligned with hole 26 in conductor bar 24. A pickup coil 32' in hole 26' is axially aligned with pickup coil 32 in hole 26, but is oppositely wound therefrom. As indicated by the direction of magnetic flux 30' influencing pickup coil 32', currents in conductor bar 24' and conductor bar 24 add as voltages are induced in pickup coils 32 and 32'. Similarly, a pickup coil 34' is disposed in hole 26' axially aligned with pickup coil 34 in hole 26 but oppositely wound therefrom. It will be recognized that voltages in pickup coil 34 and pickup coil 34' produced by current I in conductor bar 24 and conductor bar 24' add together. Connection 36 joins one end of pickup coils 32' and 34' whereby combined voltages from all four pickup coils are applied to lines 38 and 40.

The presence of oppositely wound pickup coils 32' and 34' in hole 26' cancels voltages produced by external magnetic fields which affect them equally, in the same manner as their counterparts in hole 26. Thus, substantially complete cancellation of influences of external magnetic fields is attained.

Figure 5:
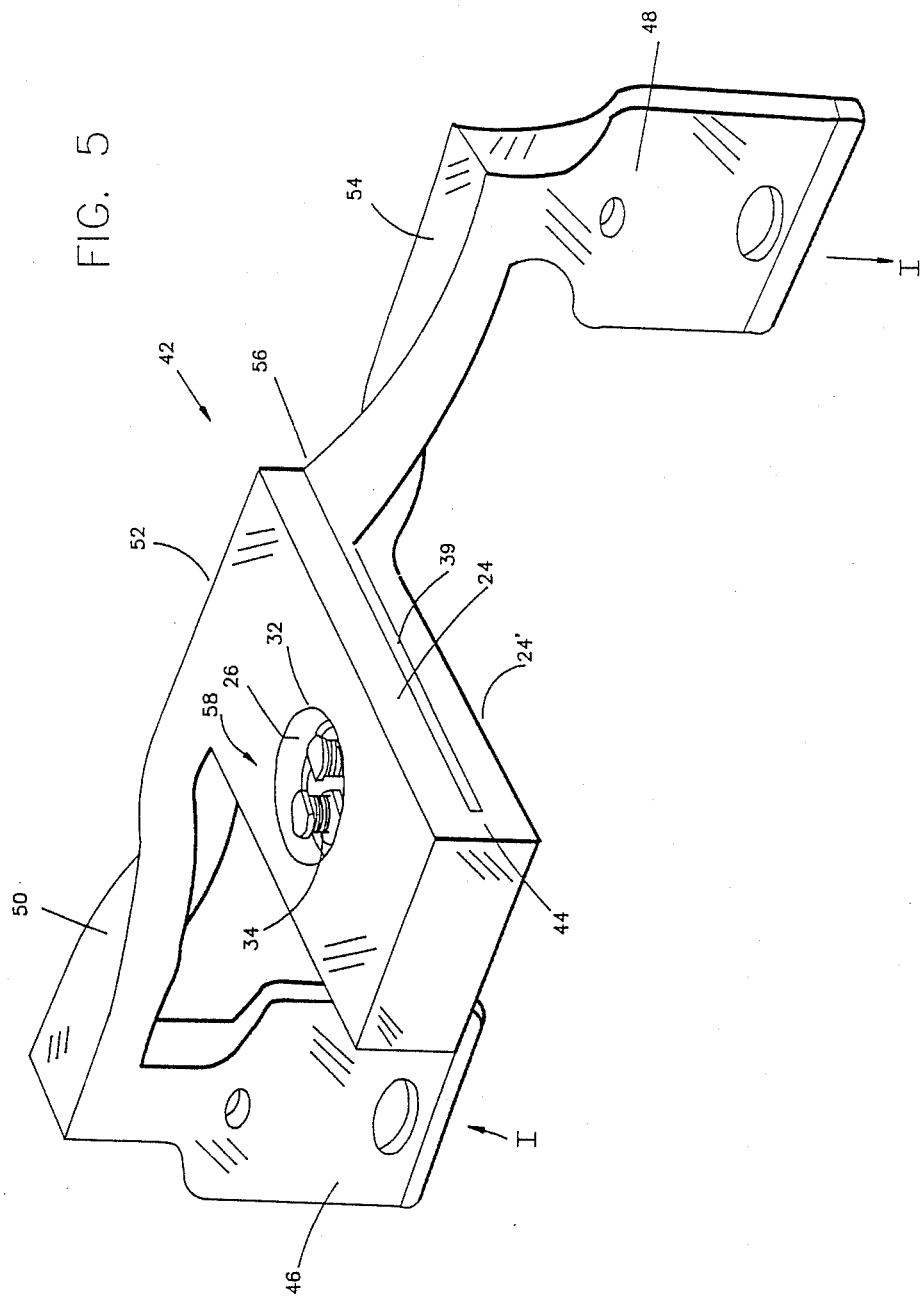
FIG. 5 is a perspective view of a folded bar current sensor according to an embodiment of the invention.

Referring now to FIG. 5, a folded bar current sensor 42 includes conductor bar 24 and conductor bar 24' as previously described. An end turn 44 joins adjacent ends of conductor bars 24 and 24' whereby a current I flowing in one direction in conductor bar 24 is identically matched by a current I flowing in the opposite direction in conductor bar 24'. Aligned holes 26 and 26' (hole 26' is hidden in the figure) are disposed generally centrally in conductor bars 24 and 24'. First and second connector lugs 46 and 48 provide for connection in a conventional manner to external circuits. A conductor bar 50 joins connector lug 46 to a free end 52 of conductor bar 24. Similarly, a conductor bar 54 joins a free end 56 of conductor bar 24' to connector lug 48.

In the preferred embodiment, connector lugs 46 and 48 conform in all respects to the industry standards for direct use in watthour meters. That is, the sizes and spacing of connector lugs 46 and 48 permit installation of folded bar current sensor 42 within an electric watthour meter. The plane of conductor bars 24 and 24' are rotated normal to the plane of connector lugs 46 and 48 for convenience and for ensuring the fit of folded bar current sensor 42 within a standard wattmeter housing. The twists shown in conductor bars 50 and 54 permit such orientation. Some installations may permit the plane of conductor bars 24 and 24' to lie parallel to that of connector lugs 46 and 48. In such installations, the illustrated twists would be omitted.

The physical sizes of conductor bars 24 and 24' are selected large enough to position holes 26 and 26' far enough away from magnetic fields generated in end turn 44 and in conductor bars 50 and 54 to avoid substantial influence of such magnetic fields. In addition, it is believed, without intending to be limited by any theory, that the amount of flux in holes 26 and 26' is inversely proportional to the widths of conductor bars 24 and 24'. Thus, the widths of conductor bars 24 and 24' may be selected on this basis. A minimum width dimension transverse to the direction of current flow may be required by the amount of metal required to carry the current I. This amount of metal is dependent upon the diameters of holes 26 and 26'. These diameters are governed, in turn, by the sizes of pickup coils 32, 32', 34 and 34'. Practical coil-winding and packaging techniques are capable of reducing the outside diameter of a coil assembly to about 0.33 inch. In one embodiment, conductor bars 24 and 24' have dimensions of 0.75 inch width transverse to the direction of current and 1.25 inch along the direction of current flow.

It is also believed that the amount of magnetic flux passing through holes 26 and 26' depends on the width of gap 39. A width of about 0.05 inch appears to be satisfactory.

Figure 6:
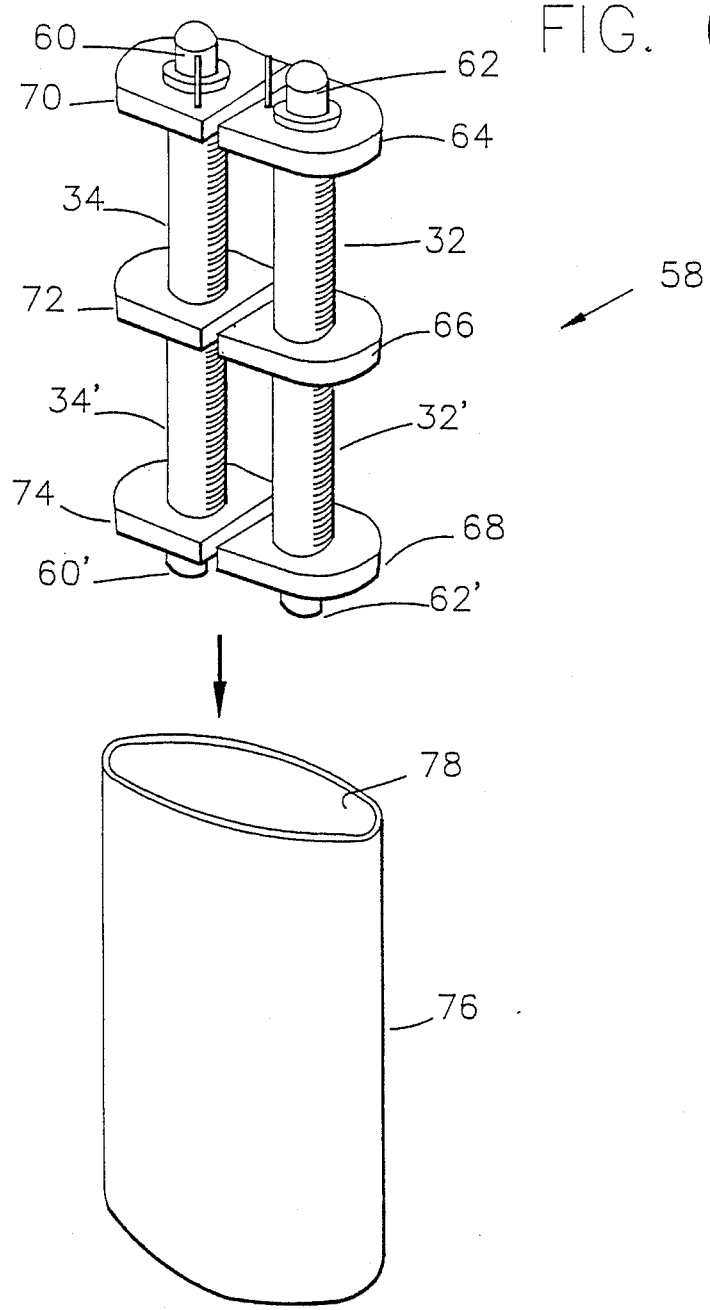
FIG. 6 is a perspective view of a coil assembly of FIG. 5.

Referring now to FIG. 6, a coil assembly 58 is shown suitable for use in the present invention. Axially aligned magnetic cores 60 and 60' bear pickup coils 34 and 34', respectively. Similarly, axially aligned magnetic cores 62 and 62' bear pickup coils 32 and 32', respectively. D-shaped insulating support spacers 64, 66 and 68 are spaced along pickup coils 32 and 32'. D-shaped insulating support spacers 70, 72 and 74 are spaced along pickup coils 34 and 34' with the flat parts of their D shapes facing corresponding parts of D-shaped insulating support spacers 64, 66 and 68, respectively.

An insulating tube 76 includes a circular opening 78 into which the remainder of coil assembly 58 fits snugly. An outside diameter of insulating tube 76 fits snugly within hole 26 (FIG. 5).

Although only line 38 and line 40 are shown emerging from coil assembly 58, it is customary to permit all eight leads of pickup coils 32, 32', 34 and 34' to extend outward from ends of coil assembly 58 for making serial and jumper connections external to coil assembly 58. Such an arrangement is assumed but is not illustrated in order to simplify the illustration and description of the invention.

Referring again to FIG. 5, I have discovered that a maximum output signal is generated when a plane separating pickup coils 32—32' and pickup coils 34—34' is parallel to a direction of current flow in conductor bars 24 and 24'. As coil assembly 58 is rotated from this parallel relationship, the magnetic flux density in the vicinity of the pickup coils is reduced and thus the output voltage is reduced. This reduction in induced voltages occurs without noticeable phase error. As the rotation of coil assembly 58 passes through 90 degrees from the above parallel relationship, the output passes through a null and then reverses. Such rotation may be used as an adjustment for setting an output of coil assembly 58 in response to a standard current I in conductor bars 24 and 24'.

The output voltage of folded bar current sensor 42 described thus far is proportional to the time derivative of the current I passing therethrough. The phase of this voltage is therefore displaced 90 degrees relative to the current. Direct use of this voltage in an electronic watthour meter, such as shown at 22 in FIG. 1, requires a corrective phase displacement of 90 degrees in the voltage. Circuits for applying such corrective phase displacements are conventional and thus do not require further attention.

In addition, due to the derivative nature of the voltage signal, any harmonic components of the current I are amplified in proportion to their harmonic number and may lead to substantial measurement errors.

Figure 7:
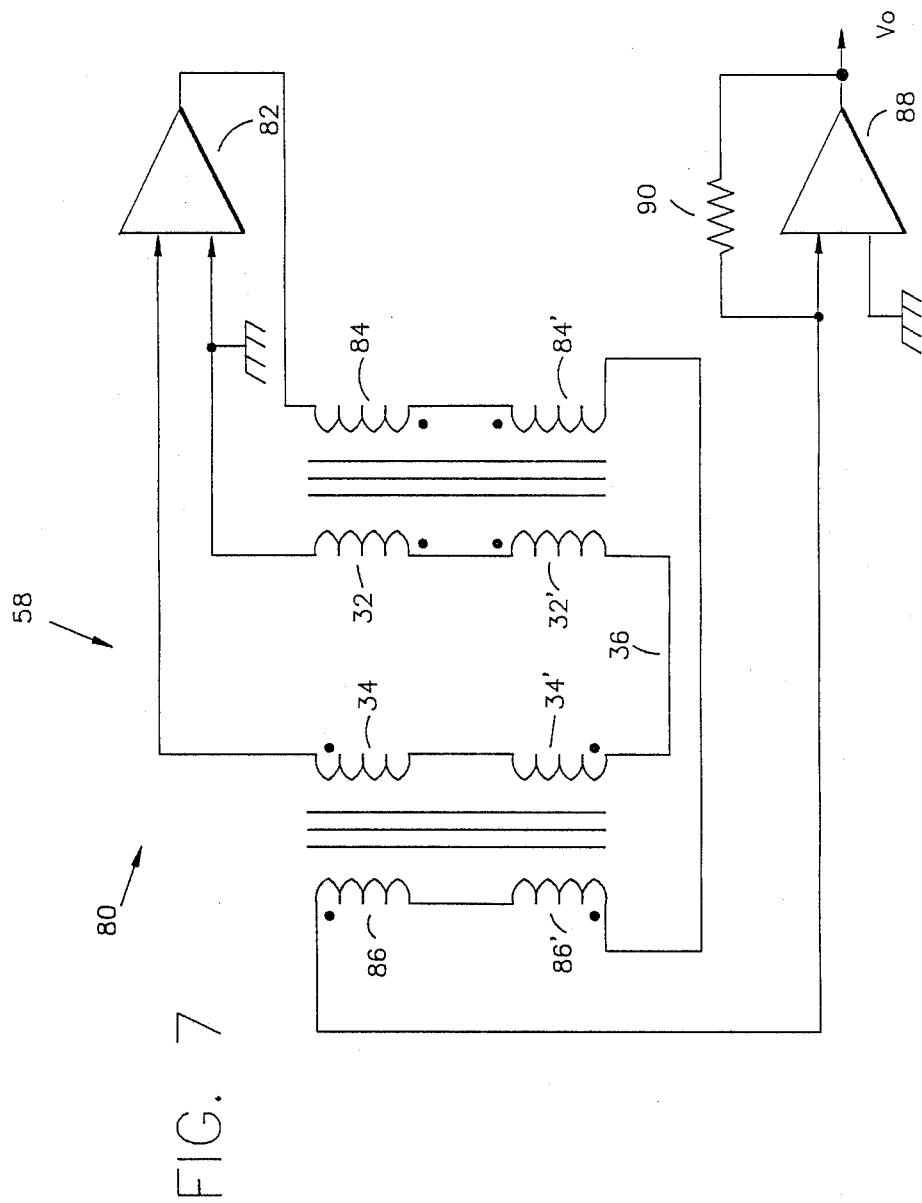
FIG. 7 is a schematic diagram of a current measurement system according to an embodiment of the invention.

Referring now to FIG. 7, a current measurement system 80 is shown including means for solving the above problems and providing a signal proportional to, and in phase with, the current I. Combined output voltages of pickup coils 32, 32', 34 and 34' are applied to the inputs of an operational amplifier 82. The output of operational amplifier 82 is connected in series through feedback windings 84, 84', 86 and 86' to an input of an output amplifier 88 having a feedback resistor 90 connected between its input and output. Feedback windings 84, 84', 86 and 86' are wound in opposition to pickup coils 32, 32', 34 and 34', respectively, whereby feedback currents produced by operational amplifier 82 tend to reduce the magnetic flux to which the cores are subjected. Due to its high gain, the current produced by operational amplifier 82 is sufficient to drive the voltage across its inputs very close to zero. In effect, this maintains the magnetic flux in the cores near zero.

In order for the magnetic flux in the cores to be zero, the magnetic flux resulting from the ampere turns in the feedback windings must be exactly equal to the magnetic flux produced by the current I. Furthermore, this equality of flux must be obtained at any instant of time. Thus, the feedback current is an accurate representation of the current I in both magnitude and phase. Amplifier 88 converts the feedback current into an output voltage Vo which is an accurate representation of the current I (FIG. 5) past coil assembly 58.

In one embodiment of the invention, a strict one-to-one turns ratio is maintained between pickup coil 32 and its corresponding feedback winding 84, as well as each of the other sets of measurement and feedback windings. This is conveniently achieved using bi-filar winding techniques. The modification of the apparatus of FIG. 7 permits achieving an apparatus having a plurality of ranges without requiring substantial increases in equipment complexity.

Figure 8:
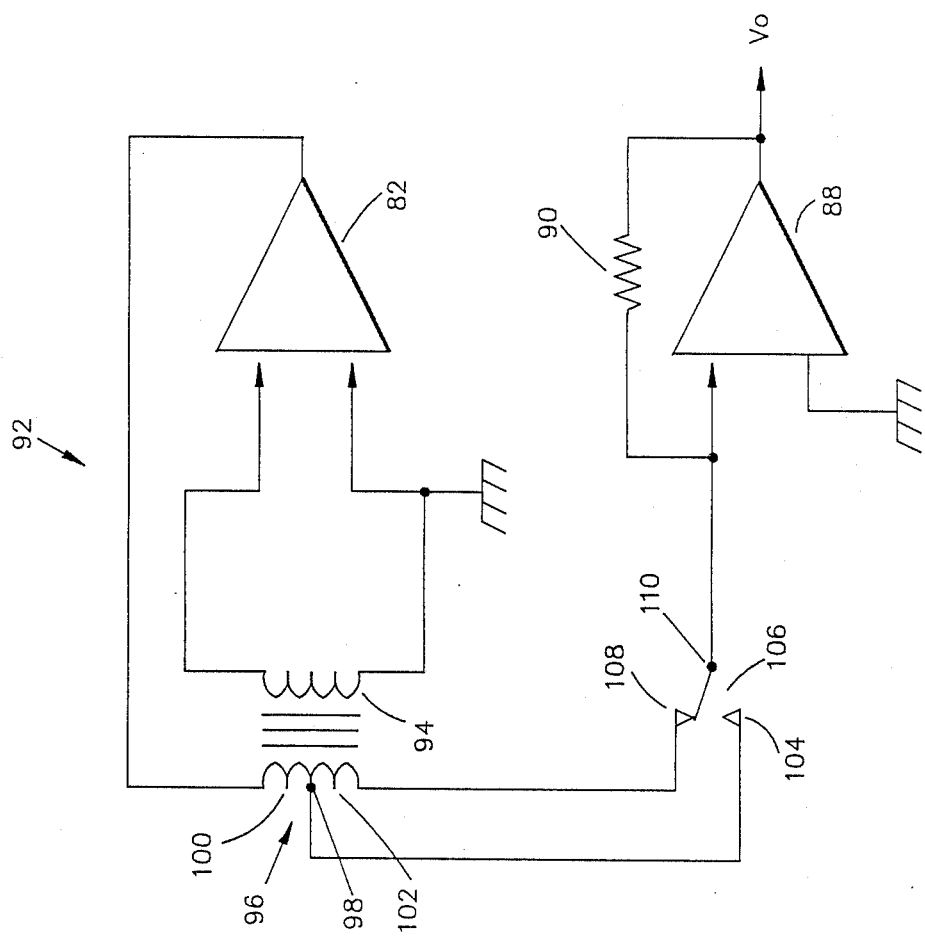
FIG. 8 is a simplified schematic diagram of a dual-range current measurement system according to an embodiment of the invention.

Referring now to FIG. 8, a dual-range current measurement system 92 is shown in which all of the measurement windings are illustrated as a single measurement winding 94 and all of the feedback windings are illustrated as a single feedback winding 96. A tap 98 divides feedback winding 96 into part windings 100 and 102. Tap 98 is connected to a first terminal 104 of a switch 106. An end of part winding 102 is connected to a second terminal 108 of switch 106. A movable terminal 110 of switch 106 is connected to the input of output amplifier 88.

The output voltage Vo produced by output amplifier 88 for a given current I depends on the setting of switch 106. Such output voltage varies according to the turns ratio of part winding 100 to feedback winding 96. Thus, a fixed sensitivity ratio in two different current ranges is achieved.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A current sensor for measuring a current, comprising:
    a first conductor bar having a first generally planar surface;
    a second conductor bar having a second generally planar surface disposed parallel to said first generally planar surface;
    a predetermined gap between said first and second generally planar surfaces;
    means for connecting adjacent first ends of said first and second conductor bars;
    means for feeding said current to a second end of said first conductor bar;
    means for receiving said current from a second end of said second conductor bar;
    a first hole generally centered in said first conductor bar and having a first axis substantially normal to said first generally planar surface;
    a second hole generally centered in said second conductor bar and having a second axis substantially normal to said second generally planar surface;
    said first and second axes being collinear;
    first and second coils in said first hole;
    third and fourth coils in said second hole;
    means for interconnecting said first, second, third and fourth coils to produce an output signal in response to magnetic fields in said first and second holes resulting from said current in said first and second conductor bars;
    said first and second coils being wound to add voltages produced by magnetic fields within said first hole and to cancel voltages produced by magnetic fields originating outside said first hole;
    said third and fourth coils being wound to add voltages produced by magnetic fields within said second hole and to cancel voltages produced by magnetic fields originating outside said second hole;
    said first and third coils being wound to add voltages produced by magnetic fields within said first and second holes and to cancel voltages produced by magnetic fields originating outside said first and second holes; and
    said second and fourth coils being wound to add voltages produced by magnetic fields within said first and second holes and to cancel voltages produced by magnetic fields originating outside said first and second holes, whereby substantial immunity to magnetic fields originating external to said first and second holes is achieved.

2. A current sensor according to claim 1, further comprising:
    said first, second, third and fourth coils having cores of magnetic material;
    at least one feedback coil;
    means for feeding a current through said at least one feedback coil; and
    said current having an amplitude and a sense effective for cancelling a net magnetic field applied to said magnetic material, whereby substantially zero flux is maintained in said magnetic material.

3. A current sensor according to claim 2, further comprising an operational amplifier responsive to said feedback current for producing an output voltage having an amplitude proportional to said feedback current and a phase substantially equal to a phase of said feedback current.

4. A current sensor according to claim 2 wherein said means for feeding a current includes:
    an operational amplifier;
    means for feeding said output signal to first and second inputs of said operational amplifier; and
    means for feeding an output of said operational amplifier through said at least one feedback coil.

5. A current sensor according to claim 3, wherein:
    said at least one feedback coil includes at least first and second portions having first and second numbers of turns;
    said first and second numbers being different; and
    means for selectively employing one of said at least first and second portions, whereby an output voltage is scaled according to said first and second numbers.

6. A current sensor according to claim 5, wherein said means for selectively employing includes a switch.

7. A current sensor for measuring a current, comprising:
    a first conductor bar having a first generally planar surface;
    a second conductor bar having a second generally planar surface disposed parallel to said first generally planar surface;
    a predetermined gap between said first and second generally planar surfaces;
    means for connecting adjacent first ends of said first and second conductor bars;
    means for feeding said current to a second end of said first conductor bar;
    means for receiving said current from a second end of said second conductor bar;

a first hole generally centered in said first conductor bar and having a first axis substantially normal to said first generally planar surface;

a second hole generally centered in said second conductor bar and having a second axis substantially normal to said second generally planar surface;

said first and second axes being collinear first and second coils in said first hole;

third and fourth coils in said second hole;

means for interconnecting said first, second, third and fourth coils to produce an output signal in response to magnetic fields in said first and second holes resulting from said current in said first and second conductor bars;

said first and second coils being wound to add voltages produced by magnetic fields within said first hole and to cancel voltages produced by magnetic fields originating outside said first hole;

said third and fourth coils being wound to add voltages produced by magnetic fields within said second hole and to cancel voltages produced by magnetic fields originating outside said second hole;

said first and third coils being wound to add voltages produced by magnetic fields within said first and second holes and to cancel voltages produced by magnetic fields originating outside said first and second holes;

said second and fourth coils being wound to add voltages produced by magnetic fields within said first and second holes and to cancel voltages produced by magnetic fields originating outside said first and second holes, whereby substantial immunity to magnetic fields originating external to said first and second holes is achieved;

said first, second, third and fourth coils having cores of magnetic material;

at least one feedback coil;

means for feeding a current through said at least one feedback coil;

said current having an amplitude and a sense effective for cancelling a net magnetic field applied to said magnetic material, whereby substantially zero flux is maintained in said magnetic material;

said means for feeding a current includes an operational amplifier;

means for feeding said output signal to said operational amplifier;

means for feeding an output of said operational amplifier through said at least one feedback coil;

an output amplifier having a first input connected to said at least one feedback coil;

a feedback element connected between an input and an output of said output amplifier; and means for connecting a reference voltage to a second input of said output amplifier, whereby said output amplfier is effective for producing an output voltage proportional to said current.

8. A coil assembly for a current sensor comprising:

first and second collinear windings having collinear axes;

said first and second collinear windings being connectable in series and having a winding sense effective for cancelling voltages produced by magnetic fields applied substantially equally thereto;

third and fourth colinear windings having collinear axes;

said third and fourth collinear windings being connectable in series and having a winding sense effective for cancelling voltages produced by magnetic fields applied substantially equally thereto;

means for disposing said axes of said first and second collinear windings parallel to said axes of said third and fourth collinear windings with said first and third windings adjacent each other and said second and fourth windings adjacent each other;

said first, second, third and fourth windings being connectable in series;

said first and third windings having a winding sense effective for cancelling voltages produced by magnetic fields applied substantially equally thereto; and said second and fourth windings having a winding sense effective for cancelling voltages produced by magnetic fields applied substantially equally thereto.

9. A coil assembly for a current sensor comprising:

first and second collinear windings;

said first and second collinear windings being connectable in series and having a winding sense effective for cancelling voltages produced by magnetic fields applied substantially equally thereto;

third and fourth collinear windings;

said third and fourth collinear windings being connectable in series and having a winding sense effective for cancelling voltages produced by magnetic fields applied substantially equally thereto;

means for disposing an axis of said first and second collinear windings parallel to an axis of said third and fourth collinear windings with said first and third windings adjacent each other and said second and fourth windings adjacent each other;

said first, second, third and fourth windings being connectable in series;

said first and third windings having a winding sense effective for cancelling voltages produced by magnetic fields applied substantially equally thereto;

said second and fourth windings having a winding sense effective for cancelling voltages produced by magnetic fields applied substantially equally thereto;

at least first and second spacers on said first and second collinear windings;

at least third and fourth spacers on said third and fourth collinear windings;

first and third mutually contacting surfaces on said first and third spacers; and second and fourth mutually contacting surfaces on said second and fourth spacers, whereby axes of said first and second and said third and fourth collinear windings are retained in a predetermined relationship.

10. A coil assembly according to claim 9 wherein said coil assembly further comprises:

a tube;

said tube having a circular opening coaxial therewith;

said at least first, second, third and fourth spacers having an external surface fittable into said circular opening whereby said coil assembly is assembleable into a single unit.

11. A method for measuring a current, comprising:

forming a folded bar including a first conductor bar having a first generally planar surface;

disposing a second conductor bar having a second generally planar surface parallel to said first generally planar surface;

spacing said first and second generally planar surfaces a predetermined distance apart;
connecting adjacent first ends of said first and second conductor bars;
feeding said current to a second end of said first conductor bar;
receiving said current from a second end of said second conductor bar;
forming a first hole generally centered in said first conductor bar and having a first axis substantially normal to said first generally planar surface;
forming a second hole generally centered in said second conductor bar and having a second axis substantially normal to said second generally planar surface;
said first and second axes being collinear;
disposing first and second coils in said first hole;
disposing third and fourth coils in said second hole;
interconnecting said first, second, third and fourth coils to produce an output signal in response to magnetic fields in said first and second holes resulting from said current in said first and second conductor bars;
winding said first and second coils to add voltages produced by magnetic fields within said first hole and to cancel voltages produced by magnetic fields originating outside said first hole;
winding said third and fourth coils to add voltages produced by magnetic fields within said second hole and to cancel voltages produced by magnetic fields originating outside said second hole;
winding said first and third coils to add voltages produced by magnetic fields within said first and second holes and to cancel voltages produced by magnetic fields originating outside said first and second holes; and
winding said second and fourth coils to add voltages produced by magnetic fields within said first and second holes and to cancel voltages produced by magnetic fields originating outside said first and second holes, whereby substantial immunity to magnetic fields originating external to said first and second holes is achieved.

* * * * *